US012744065B2

(12) United States Patent
Prakash et al.

(10) Patent No.: US 12,744,065 B2
(45) Date of Patent: Sep. 22, 2026

(54) SIGNAL RETIMING WITHIN MEMORY SYSTEMS

(71) Applicant: Micron Technology, Inc., Boise, ID (US)

(72) Inventors: Gyan Prakash, Bangalore (IN); Nidhir Kumar, Bangalore (IN); Sandeep Dwivedi, Bangalore (IN)

(73) Assignee: Micron Technology, Inc., Boise, ID (US)

( * ) Notice: Subject to any disclaimer, the term of this patent is extended or adjusted under 35 U.S.C. 154(b) by 161 days.

(21) Appl. No.: 18/639,454

(22) Filed: Apr. 18, 2024

(65) Prior Publication Data

US 2024/0363153 A1 Oct. 31, 2024

Related U.S. Application Data

(60) Provisional application No. 63/461,762, filed on Apr. 25, 2023.

(51) Int. Cl.

*G11C 7/22* (2006.01)
*G11C 7/10* (2006.01)
*G11C 29/02* (2006.01)
*G06F 13/16* (2006.01)

(52) U.S. Cl.

CPC .............. *G11C 7/22* (2013.01); *G11C 7/1093* (2013.01); *G11C 7/222* (2013.01); *G11C 29/028* (2013.01); *G06F 13/1689* (2013.01); *G11C 7/1066* (2013.01); *G11C 29/023* (2013.01); *G11C 2207/2254* (2013.01)

(58) Field of Classification Search

CPC ....... G11C 7/22; G11C 29/023; G11C 29/028; G11C 2207/2254; G11C 7/1066; G11C 7/1093; G11C 7/222; G06F 13/1689

See application file for complete search history.

(56) References Cited

U.S. PATENT DOCUMENTS

| | | | | |
|---|---|---|---|---|
| 2010/0014364 | A1* | 1/2010 | Laberge | G11C 7/1006 365/189.011 |
| 2011/0043262 | A1* | 2/2011 | Watanabe | H03L 7/0816 327/158 |
| 2020/0302979 | A1* | 9/2020 | Kim | G11C 29/028 |

* cited by examiner

*Primary Examiner* — Alexander Sofocleous
*Assistant Examiner* — Joseph Fidelis Stormes
(74) *Attorney, Agent, or Firm* — Brooks, Cameron & Huebsch, PLLC

(57) ABSTRACT

A method includes training a timing flip-flop circuit positioned between a controller and a memory resource, providing a plurality of data signals and a plurality of clock signals to the timing flip-flop circuit to generate a plurality of output clock signals and a plurality of output data signals, serializing the plurality of output clock signals and the plurality of output data signals, and providing the serialized plurality of output clock signals and the serialized plurality of output data signals to one of the controllers or the memory resources.

16 Claims, 5 Drawing Sheets

SIGNAL RETIMING WITHIN MEMORY SYSTEMS

PRIORITY INFORMATION

This application claims the benefit of U.S. Provisional Application No. 63/461,762, filed on Apr. 25, 2023, the contents of which are incorporated herein by reference.

TECHNICAL FIELD

Embodiments of the disclosure relate generally to memory sub-systems, and more specifically, relate to signal retiming.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
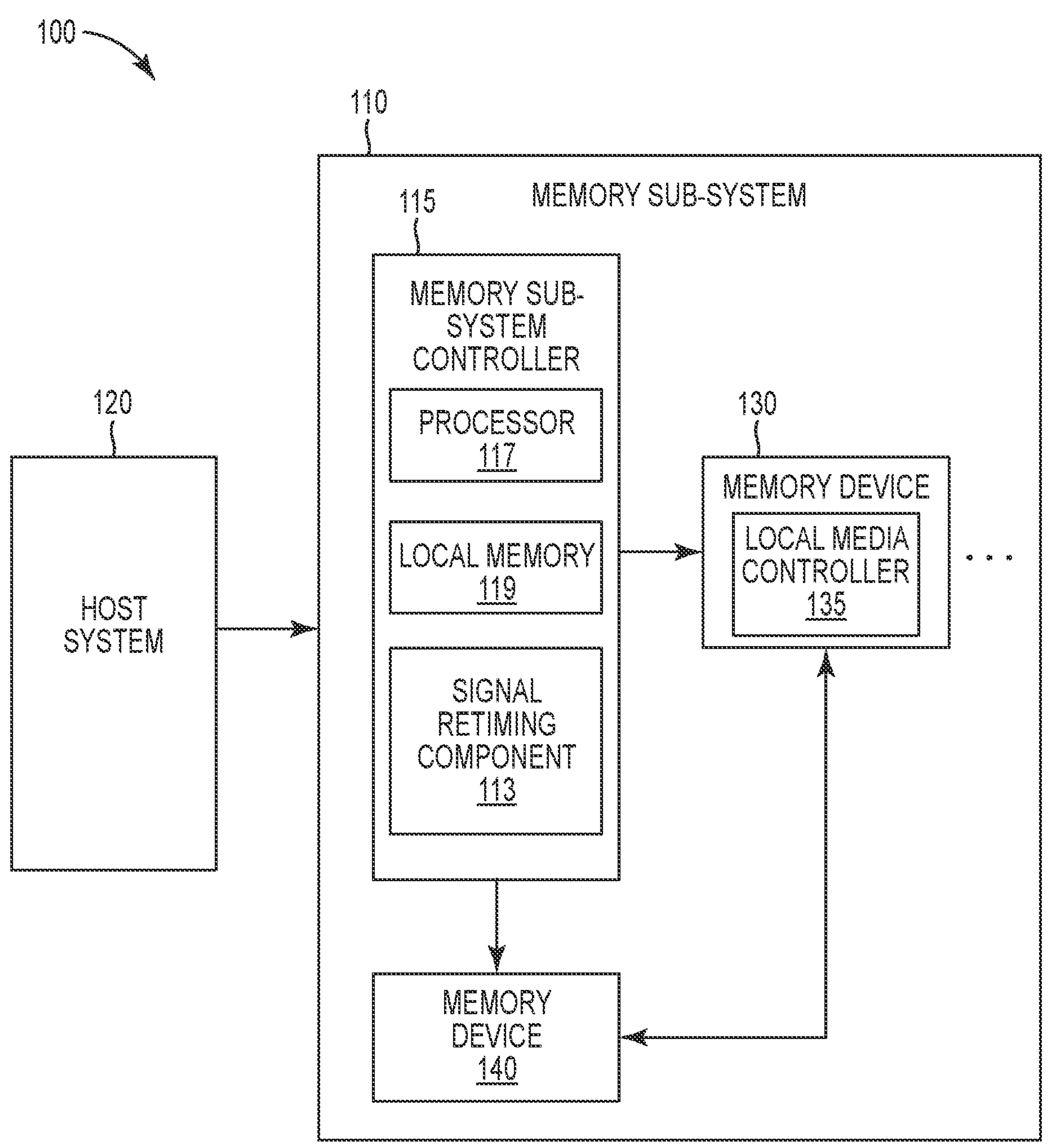
FIG. 1 illustrates an example computing system that includes a memory sub-system in accordance with some embodiments of the disclosure.

Aspects of the present disclosure are directed to signal retiming, in particular to memory sub-systems that include a signal retiming component. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device (also known as flash technology). As used herein, a NAND memory device can include either a set of flash memory dice or a combination of the flash memory dice and a non-volatile memory (NVM) controller. The NVM controller can include circuitry for performing read/write operations as described herein. Other examples of non-volatile memory devices are described below in conjunction with FIG. 1. A non-volatile memory device is a package of one or more dice. Each die can consist of one or more planes. Planes can be grouped into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area than can be erased. Pages cannot be erased individually, and only whole blocks can be erased.

Each of the memory devices can include one or more arrays of memory cells. Depending on the cell type, a cell can be written to in order to store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple level cells (TLCs), and quad-level cells (QLCs). For example, a SLC can store one bit of information and has two logic states.

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines.

In some previous approaches, an input/output (IO) expander (IOE) device can be placed between a host and memory dice. For example, an IOE device can be placed between a host device and a plurality of NAND dies (or "LUNs"). The host side of the IOE device can be referred to as a front end and the memory die side of the IOE device can be referred to as the back end. The IOE device can allow a host to see a single die load at the IOE device front side (FS). The NAND die loads can be distributed across multiple IOE back side channels. These previous IOE devices can implement a crossbar switch to route the intended traffic to target NAND dies. As used herein, a crossbar switch includes a collection of switches arranged in a matrix configuration. A crossbar switch can have multiple input and output lines that form a crossed pattern of interconnecting lines between which a connection may be established by closing a switch located at each intersection, the elements of the matrix.

In some previous approaches, the IOE device can be implemented with a buffered architecture to allow the crossbar switch to function. In this implementation, all the signals from host to NAND and vice-versa are buffered inside the IOE die and distributed to a desired port of the crossbar switch. In these approaches, the load or load average between the host and the NAND can decrease as a larger quantity of NAND die are added to the system. That is, a previous IOE will have a lower load capability between the host and the NAND as a greater quantity of NAND dice are added to the system.

Aspects of the present disclosure address the above and other deficiencies by employing an IOE device that utilizes signal retiming. For instance, aspects of the present disclosure can utilize a signal retiming component along with a plurality of flip-flop circuits (or other latch-type mechanisms) to retime incoming signals and output the retimed signals independently from the receiving end. For example, a first retiming component (e.g., write retiming component, etc.) can receive write signals from the host. In this example, the signals can be provided to a plurality of flip-flop circuits and retimed by the first retiming component and serialized based on the new timing assigned to the write signals to be provided to the NAND. In a similar way, a second retiming component (e.g., read retiming component, etc.) can be utilized when read signals are received from the NAND. For example, the read signals can be provided to a plurality of flip-flop circuits and retimed by the second retiming component before being serialized and provided to the host. In general, a flip-flop circuit or latch circuit is a circuit that has two stable states and can be used to store state information. The flip-flop circuit can be made to change state by signals applied to one or more control inputs and will have one or two outputs. In this way, the flip-flop circuit can change state information each time a signal is received at the input of the flip-flop circuit.

As described further herein, the first retiming component and the second retiming component can be calibrated or trained through a plurality of training processes. In some embodiments, the training processes can be utilized to ensure the first retiming component and second retiming component are correctly altering the timing of the data signals and clock signals that pass through the IOE device. In this way, the IOE device can utilize signal retiming to process high speed traffic by decoupling the front side and back side timing budget of, for example, a memory device in which embodiments of the present disclosure are employed. In addition, the IOE device(s) of the present disclosure can maintain pin compatibility with a standard NAND package. This enables high speed data transfer with increased NAND die loads without having to utilize a separate clock and without losing load capability, in contrast to some previous approaches.

FIG. 1 illustrates an example computing system that includes a memory sub-system 110 in accordance with some embodiments of the disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single-level cells (SLC) can store one bit per cell.

Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, a MLC portion, a TLC portion, a QLC portion, and/or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

As described above, the memory components can be memory dice or memory packages that form at least a portion of the memory device 130. In some embodiments, the blocks of memory cells can form one or more "superblocks." As used herein, a "superblock" generally refers to a set of data blocks that span multiple memory dice and are written in an interleaved fashion. For instance, in some embodiments each of a number of interleaved NAND blocks can be deployed across multiple memory dice that have multiple planes and/or pages associated therewith. The terms "superblock," "block," "block of memory cells," and/or "interleaved NAND blocks," as well as variants thereof, can, given the context of the disclosure, be used interchangeably.

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140. For instance, in some embodiments, the memory device 140 can be a DRAM and/or SRAM configured to operate as a cache for the memory device 130. In such instances, the memory device 130 can be a NAND.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local media controller 135) for media management within the same memory device package. An example of a managed memory device is a managed NAND (MNAND) device. The memory sub-system 110 can also include additional circuitry or components that are not illustrated.

The memory sub-system 110 can include a signal retiming component 113 (e.g., write timing component 206 as referenced in FIG. 2, read timing component 323 as referenced in FIG. 3, etc.), which may be referred to in the alternative as a "controller," herein. Although not shown in FIG. 1 so as to not obfuscate the drawings, the signal retiming component 113 can include various circuitry to facilitate aspects of media management, as detailed herein. In some embodiments, the signal retiming component 113 can include special purpose circuitry in the form of an ASIC, FPGA, state machine, and/or other logic circuitry that can allow the signal retiming component 113 to orchestrate and/or perform the operations described herein.

In some embodiments, the memory sub-system controller 115 includes at least a portion of the signal retiming component 113. For example, the memory sub-system controller 115 can include a processor 117 (processing device) configured to execute instructions stored in local memory 119 for performing the operations described herein. In some embodiments, the signal retiming component 113 is part of the memory sub-system 110, an application, or an operating system.

In a non-limiting example, an apparatus (e.g., the computing system 100) can include a signal retiming component 113. The signal retiming component 113 can be resident on the memory sub-system 110. As used herein, the term "resident on" refers to something that is physically located on a particular component. For example, the signal retiming component 113 being "resident on" the memory sub-system 110 refers to a condition in which the hardware circuitry that comprises the signal retiming component 113 is physically located on the memory sub-system 110. The term "resident on" can be used interchangeably with other terms such as "deployed on" or "located on," herein.

Figure 2:
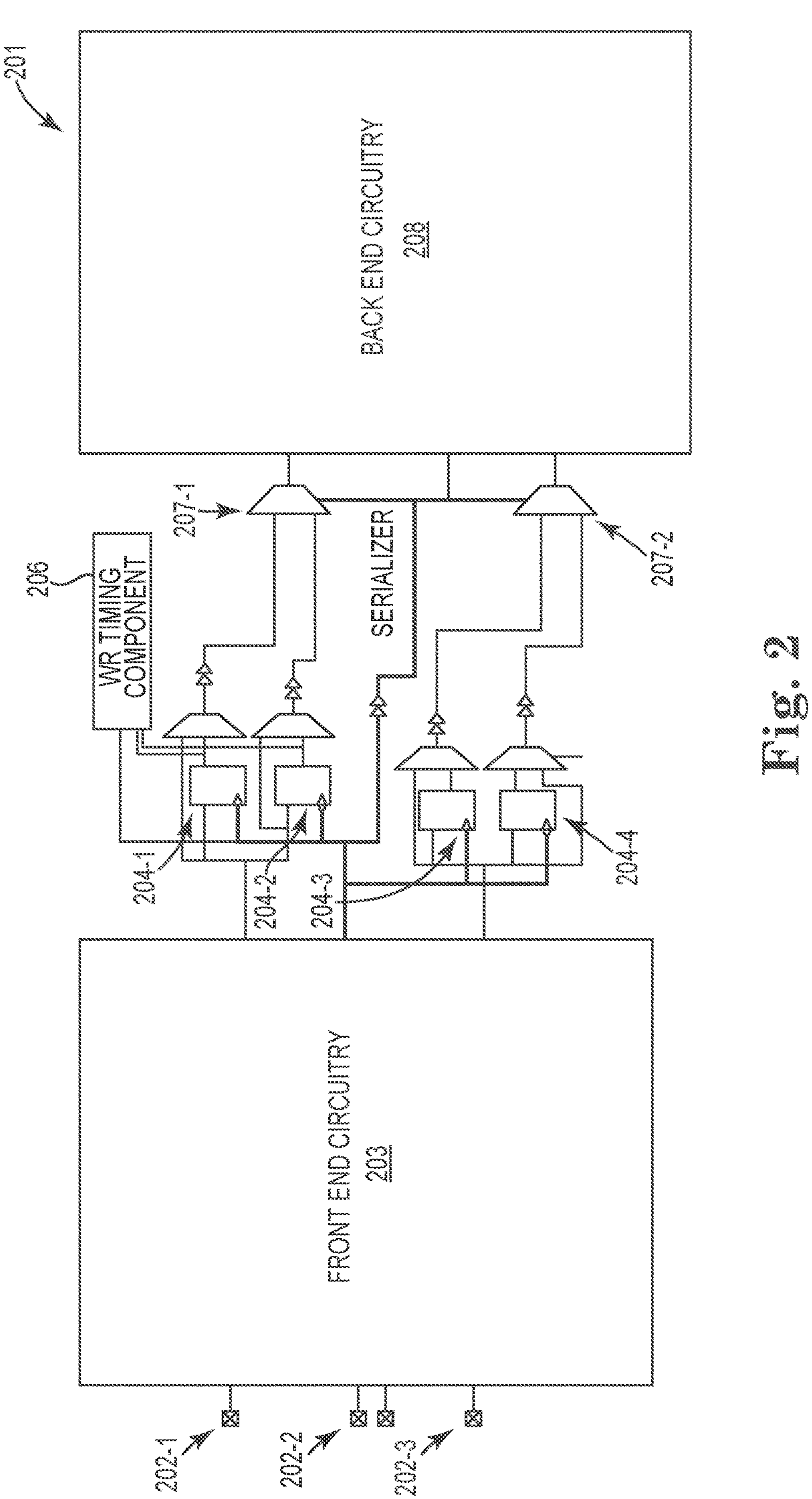
FIG. 2 illustrates a system for signal retiming in accordance with some embodiments of the disclosure.
Figure 3:
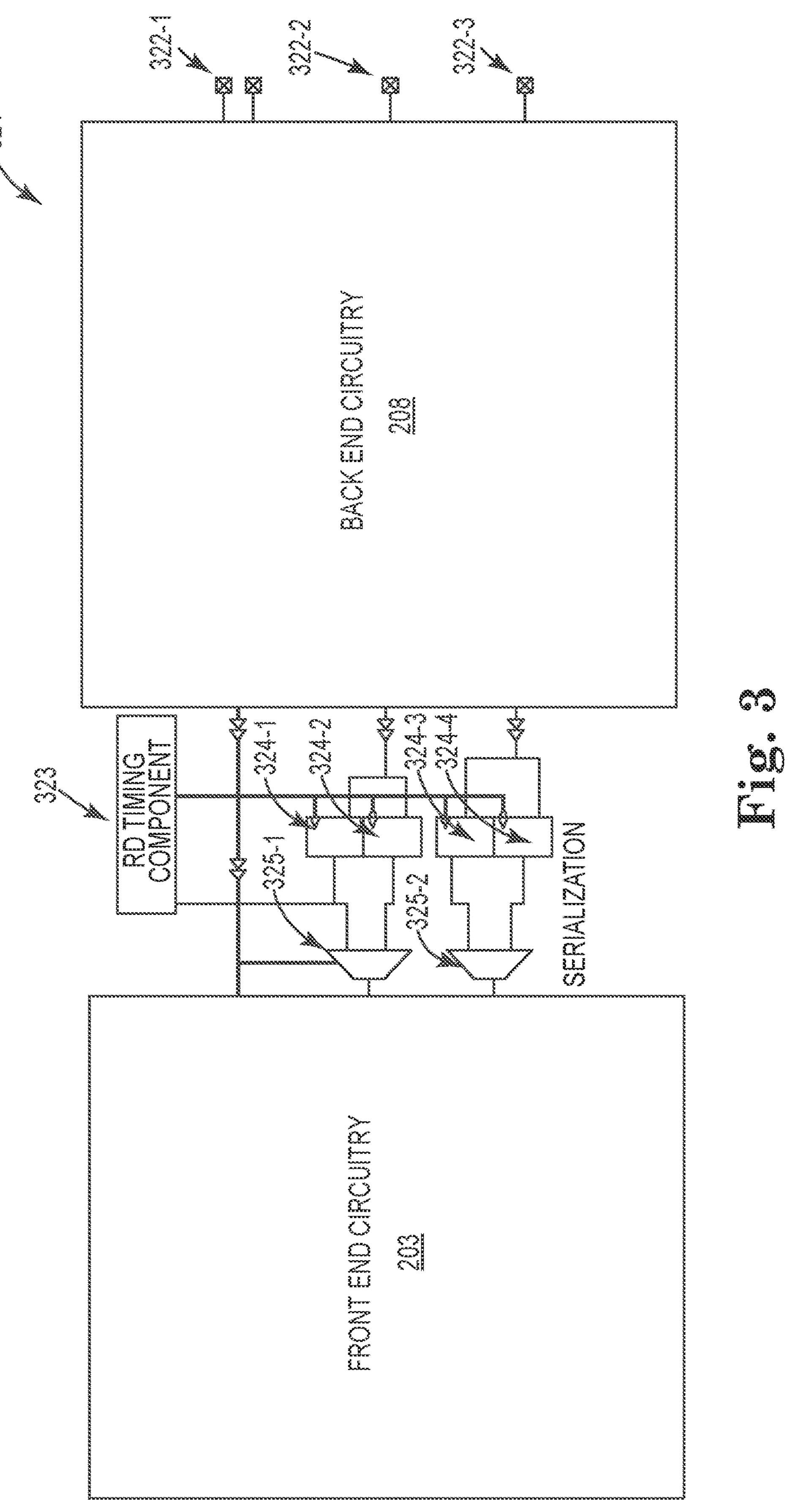
FIG. 3 illustrates a system for signal retiming in accordance with some embodiments of the disclosure.

As described further herein with reference to FIG. 2 and FIG. 3, the memory sub-system 110 can include an IOE device that includes a first set of timing flip-flop circuits to receive a first set of signals from the controller. In these embodiments, the memory sub-system 110 can include a first signal retiming component 113 to retime the first set of signals from the controller prior to providing the first set of signals to one or more memory dice of the plurality of memory dice. In some embodiments, the memory sub-system 110 can include a second set of timing flip-flop circuits to receive a second set of signals from the plurality of memory dice. In these embodiments, the memory sub-system 110 can include a second signal retiming component 113 to retime the second set of signals from the memory dice prior to providing the second set of signals to the controller. In this way, the memory sub-system 110 can retime received signals to decouple the timing budget between the front end and the back end of the IOE device without having a separate clock. As used herein, the timing budget refers to the quantity of clock signals or frequency of clock signals utilized by a particular component. Since the plurality of signals are retimed when passed from the front end to the back end, the front end can have a different quantity of clock signals than the back end or the front end can be operating at a different frequency than the back end.

In some embodiments, the memory sub-system 110 can include a delay-locked loop component (DLL) and/or a duty cycle corrector (DCC) circuit. In some embodiments, the DLL can determine a change (e.g., derivative) in a current or voltage based on inputs received from the delay line. As used herein, DCC circuits can be used to adjust the clock duty cycle of a signal. For example, the DDC circuits can be utilized to adjust the clock duty cycle to 50% for DDR (double data rate)-SDRAMs, half-rate CDRs (clock data recovery) and DLLs (delay locked loop), where both rising and falling edges of clock are used for operation.

The signal retiming component 113 can be configured to train the memory device interface through a first write training operation between the controller and the first set of flip-flop circuits and a second write training operation between the first set of flip-flop circuits and the plurality of memory dice. In these embodiments, the signal retiming component 113 can be configured to perform the first write training operation by sending a first write request to the first set of flip-flop circuits at a first frequency and determining an accuracy of the first write request at the first set of flip flop circuits at a second frequency. The write training operation will be described in further detail in reference to FIG. 2. As described further herein, existing NAND commands of the host can be utilized without additional hardware.

The signal retiming component 113 can be configured to train the memory device interface through a first read training operation between the controller and the second set of flip-flop circuits and a second read training operation between the first set of flip-flop circuits and the plurality of memory dice. In these embodiments, the signal retiming component 113 can be configured to perform the first read training operation by sending a first read request to the second set of flip-flop circuits at a first frequency and determining an accuracy of the first read request at the second set of flip-flop circuits at a second frequency. In some embodiments, the first frequency is a target frequency and the second frequency is identified as a reliable frequency, wherein the first frequency is greater than the second frequency. The read training operation will be described in further detail in reference to FIG. 3. As described further herein, existing NAND commands of the host can be utilized without additional hardware.

The signal retiming component 113 can be configured to perform a first training operation between the processing device and the first set of timing flip-flop circuits, a second training operation between the first set of timing flip-flop circuits and the non-volatile memory device, a third training operation between the non-volatile memory device and the second set of timing flip-flop circuits, and a fourth training operation between the second set of timing flip-flop circuits and the processing device. The training operations can include write training operations that will be further described in reference to FIG. 2 and a read training operation that will be further described in reference to FIG. 3.

FIG. 2 illustrates system 201 for signal retiming in accordance with some embodiments of the disclosure. The system 201 can represent a circuit diagram that can be utilized to retime a plurality of write signals from a front end circuitry 203 before providing the plurality of write signals to a back end circuitry 208. As described herein, the front end circuitry 203 can be associated with a host device and the back end circuitry 208 can be associated with memory dice. The plurality of write signals can be provided by a plurality of signal pins 202-1, 202-2, 202-3 associated with the front end circuitry 203. For example, the plurality of signal pins 202-1, 202-2, 202-3 can include a first DQ pin 202-1, a DQS pin 202-2, and/or a second DQ pin 202-3. In this way, a first DQ signal can be provided by the first DQ pin 202-1, a DQS signal can be provided by the DQS pin 202-2, and a second DQ signal can be provided by the second DQ pin 202-3.

In some embodiments, the front end circuitry 203 and the back end circuitry 208 can include a plurality of electrical components to form a circuit for performing write operations and/or read operations associated with a memory system. For example, the front end circuitry 203 and back end circuitry 208 can include a plurality of signal comparators, transistors, resistors, gates, switches, and/or other electrical components that can be utilized to provide the signals to perform a write operation and/or read operation.

The signals provided by the plurality of pins 202-1, 202-2, 202-3 can pass through the front end circuitry 203 and be provided to a plurality of timing flip-flop circuits 204-1, 204-2, 204-3, 204-4. In general, a timing flip-flop circuit (e.g., flip-flop circuit, etc.) or latch circuit is a circuit that has two stable states and can be used to store state information. The plurality of timing flip-flop circuits 204-1, 204-2, 204-3, 204-4 can be made to change state by the plurality of signals applied to one or more control inputs and will have one or two output signals. In this way, the plurality of timing flip-flop circuits 204-1, 204-2, 204-3, 204-4 can change state information of the input signals each time a signal is received at the input of the plurality of timing flip-flop circuits 204-1, 204-2, 204-3, 204-4. The plurality of timing flip-flop circuits 204-1, 204-2, 204-3, 204-4 can be utilized to identify a bit value from the signals received by the plurality of pins 202-1, 202-2, 202-3 and generate an output value.

In some embodiments, the system 201 includes a write timing component 206. The write timing component 206 can include hardware, such as a processing device, one or more co-processor devices, integrated circuit, set of discrete circuit components, and/or logic circuitry, among other hardware devices, that can perform operations described herein. For example, the write timing component 206 can be utilized to register the plurality of signals provided to the plurality of timing flip-flop circuits 204-1, 204-2, 204-3, 204-4 and register the plurality of output values generated by the plurality of timing flip-flop circuits 204-1, 204-2, 204-3, 204-4. In this way, the write timing component 206 can determine or monitor the signals provided by the plurality of pins 202-1, 202-2, 202-3, monitor the bit values associated with the signals, and/or identify the output signals generated by the plurality of timing flip-flop circuits 204-1, 204-2, 204-3, 204-4. In some embodiments, the write timing component 206 can generate a timing value for the plurality of output signals generated by the plurality of timing flip-flop circuits 204-1, 204-2, 204-3, 204-4. In this way, the write timing component 206 can retime the plurality of signals at the plurality of timing flip-flop circuits 204-1, 204-2, 204-3, 204-4.

In some embodiments, retiming the plurality of signals can decouple or separate the timing budget of the front end circuitry 203 and the back end circuitry 208. For example, the timing budget of the front end circuitry 203 is not dependent on the timing budget of the back end circuitry 208. In this way, the write timing component 206 can be utilized to retime write signals from the front end circuitry 203 such that the back end circuitry 208 utilizes the new timing value assigned by the write timing component 206 and may not utilize the timing value assigned by the front end circuitry 203. In these embodiments, the write timing component 206 is able to retime the plurality of signals without utilizing an additional clock.

In some embodiments, the write timing component 206 is arranged as a shift register that can register the plurality of signals received at the plurality of timing flip-flop circuits 204-1, 204-2, 204-3, 204-4. In some embodiments a shift register can be a first-in first-out (FIFO) device to buffer communication between a memory device and a controller during read operations and/or write operations.

A FIFO device can be utilized to buffer communication signals between devices that operate at different speeds or utilize independent clock signals. Since the write timing component 206 is retiming the plurality of signals, the front end circuitry 203 and the back end circuitry 208 can be operating at different clocking speeds (e.g., using clocks with different frequencies) and/or utilizing a different timing budget. In some embodiments, a FIFO device can release data from the buffer in the order of its arrival. That is, a signal can be provided to an input of a FIFO device and be released at an output of the FIFO device in the order it was received at the input of the FIFO device. In this way, the bit to be written to the back end circuitry 208 can be determined and added to the FIFO device of the write timing component 206 at the plurality of timing flip-flop circuits 204-1, 204-2, 204-3, 204-4 to be retimed and provided to serializer circuits 207-1, 207-2.

As used herein, the serializer circuits 207-1, 207-2 can convert the retimed signals from the plurality of timing flip-flop circuits 204-1, 204-2, 204-3, 204-4 to bits that can stored on a memory device (e.g., NAND dice, etc.). In some embodiments, the serializer circuits 207-1, 207-2 can receive the output signals from the plurality of timing flip-flop circuits 204-1, 204-2, 204-3, 204-4 and/or the output signals form the FIFO device of the write timing component 206 to serialize the data to be provided to the back end circuitry 208. In some embodiments, the serializer circuits 207-1, 207-2 can be utilized for dual data generation. In some embodiments, the serializer circuits 207-1, 207-2 can be utilized to embed the retiming clock signal from the write timing component 206 into the output signal from the plurality of timing flip-flop circuits 204-1, 204-2, 204-3, 204-4. In this way, the retiming clock signal can be embedded into the output signals from the plurality of timing flip-flop circuits 204-1, 204-2, 204-3, 204-4 to be utilized by the back end circuitry 208.

In some embodiments, the system 201 can include a delay-locked loop component (DLL) and/or a duty cycle corrector (DCC) circuit. In some embodiments, the DLL can determine a change (e.g., derivative) in a current or voltage based on inputs received from the delay line. As used herein, DCC circuits can be used to adjust the clock duty cycle of a signal. For example, the DDC circuits can be utilized to adjust the clock duty cycle to 50% for DDR (double data rate)-SDRAMs, half-rate CDRs (clock data recovery) and DLLs (delay locked loop), where both rising and falling edges of clock are used for operation.

In some embodiments, the system 201 can perform a training process during an initialization period. The training process can be performed to train the write timing component 206 to ensure the write timing component 206 is correctly retiming the signals received at the plurality of timing flip-flop circuits 204-1, 204-2, 204-3, 204-4. As described herein, the training process can include a write training process performed on the system 201 and a read training process that can be performed on the system 321 as referenced in FIG. 3. In some embodiments, the write training process is a bifurcated training process.

In some embodiments, the bifurcated training process can be utilized to train the write timing component 206 utilizing a write front side process followed by a write back side process. In some embodiments, a plurality of signals can be sent to the plurality of timing flip-flop circuits 204-1, 204-2, 204-3, 204-4 at a first speed (e.g., high speed, target frequency for high speed transfer, etc.) and returned to the front end circuitry 203 at a second speed (e.g., low speed, reliable frequency, etc.). In this way, the bifurcated training process can determine if front end and back end writing processes are performed correctly. In some embodiments, the training processes can utilize existing commands (e.g., NAND commands, etc.), such that additional hardware is not needed to perform the training processes.

In a specific example, the write front side process can include putting the system 201 into a training mode. In some embodiments, the front end circuitry 203 can provide a burst length of 32 bytes (BL32) pseudo-random bit sequence (PRBS) write at a first frequency to a particular die of the memory resource (e.g., NAND die, etc.). In these embodiments, the first frequency can be a target frequency for high speed transfers. This BL32 write at the first frequency is not provided to the back end circuitry 208 or written to a memory resource. That is, the BL32 write is limited to the plurality of timing flip-flop circuits 204-1, 204-2, 204-3, 204-4. In these embodiments, when the BL32 write is received at the plurality of timing flip-flop circuits 204-1, 204-2, 204-3, 204-4, the counters can be cleared and a weak pull of the DQS can be enabled.

In these embodiments, the write front side training process include performing a read of the BL32 at a second frequency (e.g., reliable frequency, etc.) by routing the output signals from the plurality of timing flip-flop circuits 204-1, 204-2, 204-3, 204-4 back to the read DQS pin of the front end circuitry 203. Upon receiving the output signals from the plurality of timing flip-flop circuits 204-1, 204-2, 204-3, 204-4, the weak pull of the DQS can be disabled. This can end the write front side process. In some embodiments, firmware associated with the system 201 can perform two dimensional training for the host write path (e.g., SDLL, DCC, VREF, etc.).

As described herein, the write front side training process can be performed separately from the write back side training process. The write back side training process can begin by initiating the write back side training process. In some embodiments, the write back side training process can be similar to the write front side training process in that a BL32 is instructed to be written to a particular memory die. However, in this embodiment, the BL32 is actually written to the particular memory die at the first frequency or target frequency. In this way, the back side can be tested by performing a read operation of the BL32 at the particular memory die to determine if it was written correctly on the back side. When the write front side training process and the write back side training process are complete, the write timing component 206 can be utilized.

FIG. 3 illustrates system 321 for signal retiming in accordance with some embodiments of the disclosure. The system 321 can represent a circuit diagram that can be utilized to retime a plurality of read signals from a back end circuitry 208 before providing the plurality of read signals to a front end circuitry 203. As described herein, the front end circuitry 203 can be associated with a host device and the back end circuitry 208 can be associated with memory dice of, for example, a memory device. The plurality of read signals can be provided by a plurality of signal pins associated with the back end circuitry 208. For example, the plurality of signal pins can include a DQS pin 322-1, a first DQ pin 322-2, and/or a second DQ pin 322-3. In this way, a first DQ signal can be provided by the first DQ pin 322-2, a DQS signal can be provided by the DQS pin 322-1, and a second DQ signal can be provided by the second DQ pin 322-3.

As described herein, the front end circuitry 203 and the back end circuitry 208 can include a plurality of electrical components to form a circuit for performing write operations and/or read operations associated with a memory system. For example, the front end circuitry 203 and back end circuitry 208 can include a plurality of signal comparators, transistors, resistors, gates, switches, and/or other electrical components that can be utilized to provide the signals to perform a write operation and/or read operation.

The signals provided by the plurality of pins 322-1, 322-2, 322-3 can pass through the back end circuitry 208 and be provided to a plurality of timing flip-flop circuits 324-1, 324-2, 324-3, 324-4. In general, a flip-flop circuit or latch circuit is a circuit that has two stable states and can be used to store state information. The plurality of timing flip-flop circuits 324-1, 324-2, 324-3, 324-4 can be made to change state by the plurality of signals applied to one or more control inputs and will have one or two output signals. In this way, the plurality of timing flip-flop circuits 324-1, 324-2, 324-3, 324-4 can change state information of the input signals each time a signal is received at the input of the plurality of timing flip-flop circuits 324-1, 324-2, 324-3, 324-4. The plurality of timing flip-flop circuits 324-1, 324-2, 324-3, 324-4 can be utilized to identify a bit value from the signals received by the plurality of pins 322-1, 322-2 322-3 and generate an output value.

In some embodiments, the system 321 includes a read timing component 323. The read timing component 323 can perform similar operations as the write timing component 206 as referenced in FIG. 2. For examples, the read timing component 323 can be utilized to monitor the plurality of signals provided to the plurality of timing flip-flop circuits 324-1, 324-2, 324-3, 324-4 and monitor the plurality of output values generated by the plurality of timing flip-flop circuits 324-1, 324-2, 324-3, 324-4. In this way, the read timing component 323 can determine or monitor the signals provided by the plurality of pins 322-1, 322-2, 322-3, monitor the bit values associated with the signals, and/or identify the output signals generated by the plurality of timing flip-flop circuits 324-1, 324-2, 324-3, 324-4. In some embodiments, the read timing component 323 can generate a timing value for the plurality of output signals generated by the plurality of timing flip-flop circuits 324-1, 324-2, 324-3, 324-4. In this way, the read timing component 323 can retime the plurality of signals at the plurality of timing flip-flop circuits 324-1, 324-2, 324-3, 324-4.

In some embodiments, retiming the plurality of signals can decouple or separate the timing budget of the front end circuitry 203 and the back end circuitry 208. For example, the timing budget of the front end circuitry 203 is not dependent on the timing budget of the back end circuitry 208. In this way, the read timing component 323 can be utilized to retime read signals from the back end such that the front end utilizes the new timing value assigned by the read timing component 323 and may not utilize the timing value assigned by the back end circuitry 208. In these embodiments, the read timing component 323 is able to retime the plurality of signals without utilizing an additional clock.

In some embodiments, the read timing component 323 is arranged as a shift register that is able to register the plurality of signals received at the plurality of timing flip-flop circuits 324-1, 324-2, 324-3, 324-4. As described herein, a shift register can be a FIFO device to buffer communication between a memory device and a controller during read operations and/or write operations.

Since the read timing component 323 is retiming the plurality of signals, the front end circuitry 203 and the back end circuitry 208 can technically be operating at different speeds (e.g., clocking frequencies) or utilizing a different timing budget. As described herein, a FIFO device can release data from the buffer in the order of its arrival. In this way, the bit to be read at the front end circuitry 203 can be determined and added to the FIFO device of the read timing component 323 at the plurality of timing flip-flop circuits 324-1, 324-2, 324-3, 324-4 to be retimed and provided to serializer circuits 325-1, 325-2.

As used herein, the serializer circuits 325-1, 325-2 can convert the retimed signals from the plurality of timing flip-flop circuits 324-1, 324-2, 324-3, 324-4 to bits that can be read by a host. In some embodiments, the serializer circuits 325-1, 325-2 can receive the output signals from the plurality of timing flip-flop circuits 324-1, 324-2, 324-3, 324-4 and/or the output signals from the FIFO device of the read timing component 323 to serialize the data to be provided to the front end circuitry 203. In some embodiments, the serializer circuits 325-1, 325-2 can be utilized for dual data generation. In some embodiments, the serializer circuits 325-1, 325-2 can be utilized to embed the retiming clock signal from the read timing component 323 into the output signal from the plurality of timing flip-flop circuits 324-1, 324-2, 324-3, 324-4. In this way, the retiming clock signal can be embedded into the output signals from the plurality of timing flip-flop circuits 324-1, 324-2, 324-3, 324-4 to be utilized by the front end circuitry 203.

In some embodiments, the system 321 can perform a training process during an initialization period. The training process can be performed to train the read timing component 323 to ensure the read timing component 323 is correctly retiming the signals received at the plurality of timing flip-flop circuits 324-1, 324-2, 324-3, 324-4. As described herein, the training process can include a write training process performed on the system 201 as referenced in FIG. 2 and a read training process that can be performed on the system 321. In some embodiments, the read training process is a bifurcated training process.

In some embodiments, the bifurcated training process can be utilized to train the read timing component 323 utilizing a read back side process followed by a read front side process. In some embodiments, the read back side process can be initiated. The read back side process can include having a BL32 PRBS write to a particular memory die utilizing the second frequency or reliable frequency. In these embodiments, a read request can be utilized at a target frequency or fast frequency for the BL32 of the particular memory die. In a similar way to the front end write training process, the host can ignore the BL32. In these embodiments, when the BL32 read is received at the plurality of timing flip-flop circuits 324-1, 324-2, 324-3, 324-4, the counters can be cleared and a weak pull of the DQS can be enabled. In these embodiments, the read data of the BL32 are routed from the plurality of timing flip-flop circuits 324-1, 324-2, 324-3, 324-4 to the read DQS. Upon receiving the output signals from the plurality of timing flip-flop circuits 324-1, 324-2, 324-3, 324-4, the weak pull of the DQS can be disabled. This can end the read back side process. In some embodiments, firmware associated with the system 321 can perform two dimensional training for the host write path (e.g., SDLL, DCC, VREF, etc.).

As described herein, the read front side training process can be performed separately from the read back side training process. The read front side training process can begin by initiating the read front side training process. In some embodiments, the read front side training process can be similar to the read back side training process in that a BL32 is instructed to be read from a particular memory die. However, in this embodiment, the BL32 is actually read from the particular memory die at the first frequency or target frequency. In this way, the front side can be tested by performing a read operation of the BL32 at the particular memory die to determine if it was read correctly on the back side. When the read front side training process and the read back side training process are complete, the read timing component 323 can be utilized.

Figure 4:
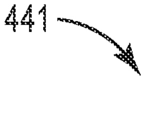
FIG. 4 is a flow diagram corresponding to a method for signal retiming in accordance with some embodiments of the disclosure.
Figure 4:
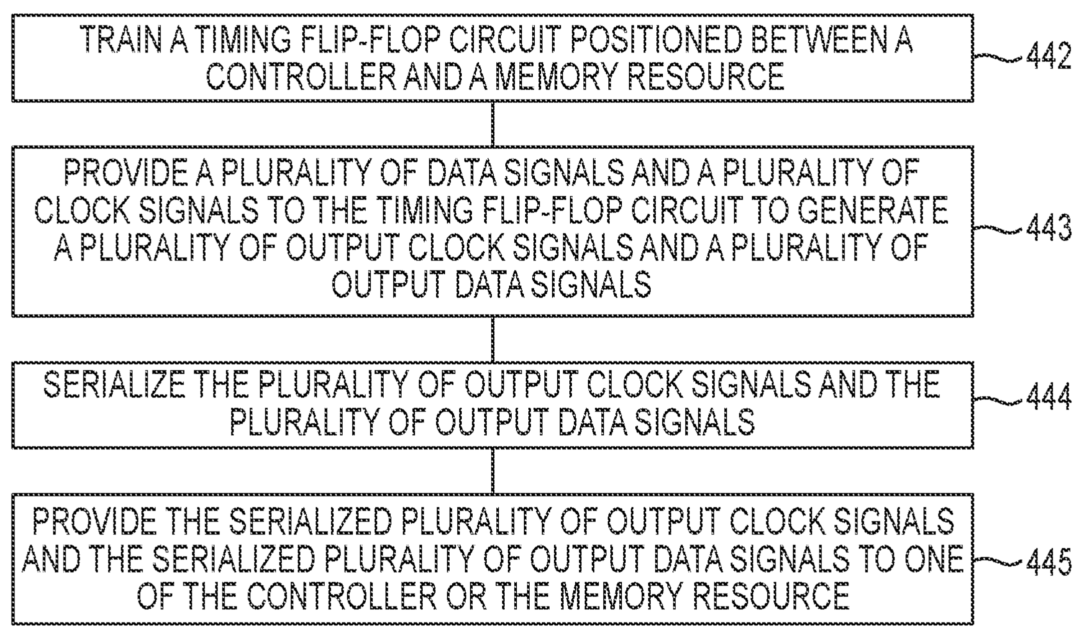

FIG. 4 is a flow diagram corresponding to a method 441 for signal retiming in accordance with some embodiments of the disclosure. The method 441 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 441 is performed by the signal retiming component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 442, the method 441 can be executed to train a timing flip-flop circuit positioned between a controller and a memory resource. As described herein, the flip-flop circuit or plurality of flip-flop circuits can be positioned between a host device (e.g., controller, etc.) and a memory resource (e.g., NAND dice, etc.). For example, the timing flip-flop circuits can be positioned within a IOE device that couples a host to a plurality of NAND dice.

In some embodiments, training the timing flip-flop circuit further comprises performing a read training operation and performing a write training operation. As described herein, a flip-flop circuit and/or a training component associated with the flip-flop circuit can be trained by performing a write or read operation and determining whether the training component correctly retimes the write or read operation. As described further herein, the training operation can utilize different speeds depending on the type of training operation.

In some embodiments, training the timing flip-flop circuit includes providing, by the controller, a particular data signal and a particular clock signal to the timing flip-flop circuit at a first speed (e.g., target frequency, target speed, fast speed, etc.) and providing, by the timing flip-flop circuit, an output of the particular data signal and an output of the particular clock signal to the controller at a second speed (e.g., dependable speed, dependable frequency, slow speed, etc.). In these embodiments, the training can include comparing, by the controller, the particular data signal to the output of the particular data signal and comparing the particular clock signal to the output of the particular clock signal. As described herein, the read or write operation performed at the first speed can be compared to the read or write operation performed at the second speed to confirm that the data signals were retimed correctly and correctly executed by the IOE device.

At operation 443, the method 441 can be executed to provide a plurality of data signals and a plurality of clock signals to the timing flip-flop circuit to generate a plurality of output clock signals and a plurality of output data signals. As described herein, the plurality of output data signals can be retimed by a training component associated with the flip-flop circuit. For example, the training component can determine a bit value of the plurality of data signals and the plurality of clock signals. In this example, the training component can retime the plurality of output clock signals and the plurality of output data signals to be utilized by a serializer.

At operation 444, the method 441 can be executed to serialize the plurality of output clock signals and the plurality of output data signals. As described herein, a serializer can be utilized to provide dual data generation utilizing the plurality of output data signals and the plurality of output clock signals. In some embodiments, serializing the plurality of output clock signals and the plurality of output data signals further comprises decoupling a timing budget between the controller and the memory resource. In some embodiments, a timing budget of the controller is separate from a timing budget of the plurality of memory dice. That is, the controller can operate at a first frequency or speed and the plurality of memory dice can operate at a second frequency or speed.

At operation 445, the method 441 can be executed to provide the serialized plurality of output clock signals and the serialized plurality of output data signals to one of the controllers or the memory resource. As described herein, a write serializer can operate to provide signals to the memory resource when there is a write operation and a read serializer can operate to provide signals to the controller when there is a read operation.

Figure 5:
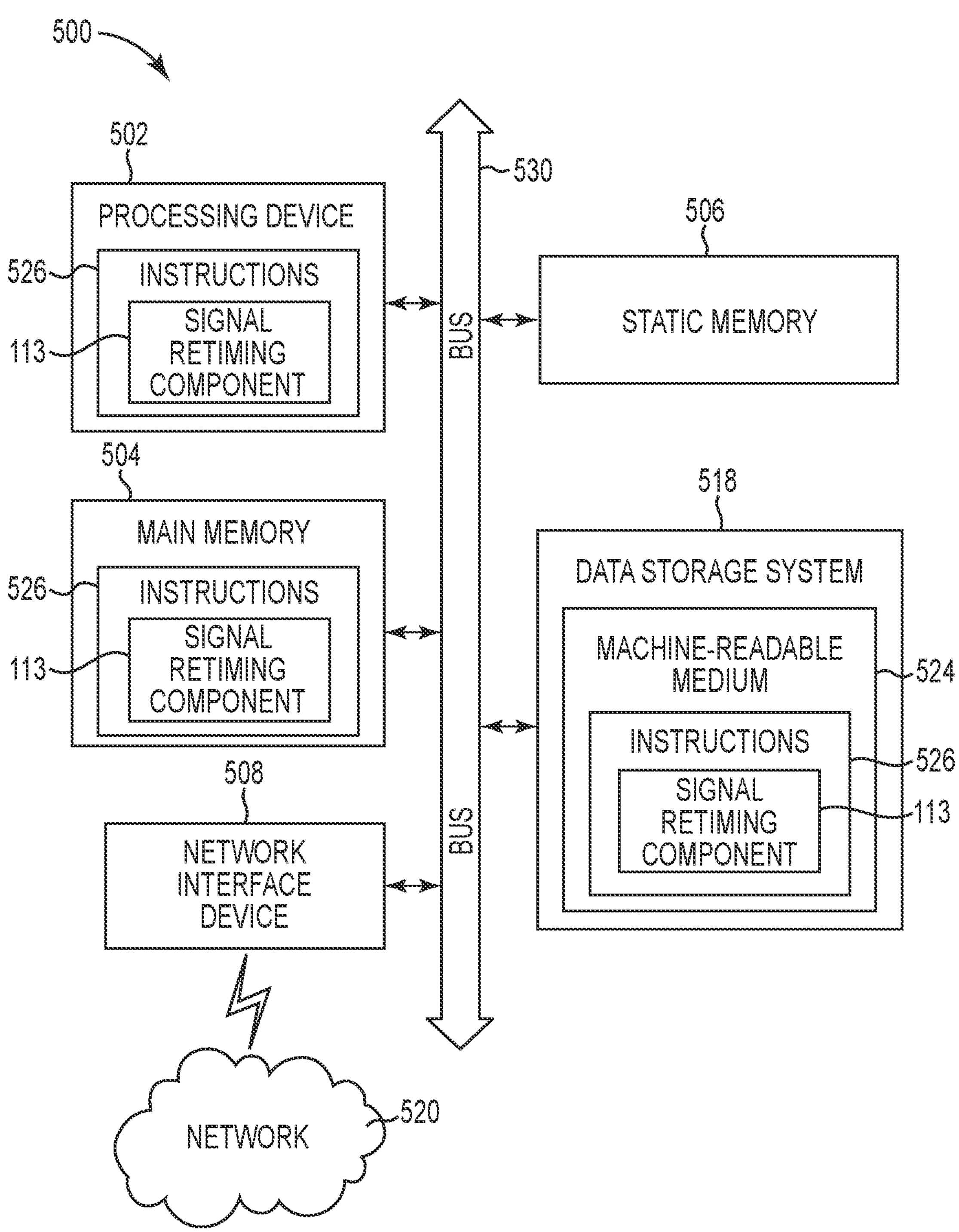
FIG. 5 is a block diagram of an example computer system in which embodiments of the disclosure may operate.

FIG. 5 is a block diagram of an example computer system in which embodiments of the disclosure may operate. For example, FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the signal retiming component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

The processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a signal retiming component (e.g., the signal retiming component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer.

Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer).

In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc. In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:

training a timing flip-flop circuit positioned between a controller and a memory resource;

providing a plurality of data signals and a plurality of clock signals to the timing flip-flop circuit to generate a plurality of output clock signals and a plurality of output data signals;

serializing the plurality of output clock signals and the plurality of output data signals, wherein serializing the plurality of output clock signals and the plurality of output data signals further comprises decoupling a timing budget between the controller and the memory resource; and providing the serialized plurality of output clock signals and the serialized plurality of output data signals to one of the controllers or the memory resources.

2. The method of claim 1, wherein each of the plurality of clock signals correspond to one of the plurality of data signals.

3. The method of claim 1, wherein training the timing flip-flop circuit comprises providing, by the controller, a particular data signal and a particular clock signal to the timing flip-flop circuit at a first speed and providing, by the timing flip-flop circuit, an output of the particular data signal and an output of the particular clock signal to the controller at a second speed.

4. The method of claim 3, further comprising comparing, by the controller, the particular data signal to the output of the particular data signal and comparing the particular clock signal to the output of the particular clock signal.

5. The method of claim 1, wherein the training the timing flip-flop circuit is configured to perform an operation by comparing signals provided to the timing flip-flop circuit and output signals from the timing flip-flop circuit during an initialization period.

6. The method of claim 1, wherein serializing the plurality of output clock signals and the plurality of output data signals further comprises retiming the plurality of output data signals.

7. The method of claim 1, wherein training the timing flip-flop circuit further comprises performing a read training operation and performing a write training operation.

8. An apparatus, comprising:

a controller;

a plurality of memory dice; and a memory device interface to transfer communication between the controller and the plurality of memory dice, the memory device interface comprising:

a first set of timing flip-flop circuits to receive a first set of signals from the controller;

a first serializer to retime the first set of signals from the controller prior to providing the first set of signals to one or more memory dice of the plurality of memory dice;

a second set of timing flip-flop circuits to receive a second set of signals from the plurality of memory dice;

a second serializer to retime the second set of signals from the memory dice prior to providing the second set of signals to the controller;

a delay-locked loop (DLL) component; and a duty cycle corrector (DCC) circuit.

9. The apparatus of claim 8, wherein a timing budget of the controller is separate from a timing budget of the plurality of memory dice.

10. The apparatus of claim 8, wherein the controller is configured to train the memory device interface through a first read training operation between the controller and the second set of flip-flop circuits and a second read training operation between the first set of flip-flop circuits and the plurality of memory dice.

11. The apparatus of claim 10, wherein the controller is configured to perform the first read training operation by sending a first read request to the second set of flip-flop circuits at a first frequency and determining an accuracy of the first read request at the second set of flip-flop circuits at a second frequency.

12. The apparatus of claim 11, wherein the first frequency is a target frequency and the second frequency is identified as a reliable frequency, wherein the first frequency is greater than the second frequency.

13. A system comprising:

a memory sub-system comprising a non-volatile memory device; and a processing device coupled to the memory sub-system by a memory device interface, the memory device interface comprising:

a first set of timing flip-flop circuits to receive a first set of signals from the processing device and register a first value associated with the first set of signals;

a first serializer to retime the first set of signals from the processing device based on the first value prior to providing the first set of signals to one or more memory dice of the non-volatile memory device;

a second set of timing flip-flop circuits to receive a second set of signals from the non-volatile memory device and register a second value associated with the second set of signals;

a second serializer to retime the second value from the non-volatile memory device based on the second value prior to providing the second set of signals to the processing device; and wherein the processing device is configured to perform:

a first training operation between the processing device and the first set of timing flip-flop circuits, a second training operation between the first set of timing flip-flop circuits and the non-volatile memory device, a third training operation between the non-volatile memory device and the second set of timing flip-flop circuits, and a fourth training operation between the second set of timing flip-flop circuits and the processing device.

14. The system of claim 13, wherein the first set of signals include a first data signal and a corresponding clock signal associated with a write operation and the second set of signals include a second data signal and a corresponding clock signal associated with a read operation.

15. The system of claim 13, wherein the first set of timing flip-flop circuits are arranged as a first shift register and the second set of timing flip-flop circuits are arranged as a second shift register.

16. An apparatus, comprising:

a controller;

a plurality of memory dice; and a memory device interface to transfer communication between the controller and the plurality of memory dice, the memory device interface comprising:

a first set of timing flip-flop circuits to receive a first set of signals from the controller;

a first serializer to retime the first set of signals from the controller prior to providing the first set of signals to one or more memory dice of the plurality of memory dice;

a second set of timing flip-flop circuits to receive a second set of signals from the plurality of memory dice;

a second serializer to retime the second set of signals from the memory dice prior to providing the second set of signals to the controller, wherein the controller is configured to train the memory device interface through:

a first write training operation between the controller and the first set of timing flip-flop circuits by sending a first write request to the first set of timing flip-flop circuits at a first frequency and determining an accuracy of the first write request at the first set of timing flip-flop circuits at a second frequency; and a second write training operation between the first set of timing flip-flop circuits and the plurality of memory dice.

* * * * *